United States Patent [19]

Palara et al.

[11] Patent Number: 4,555,674
[45] Date of Patent: Nov. 26, 1985

[54] POWER AUDIO-AMPLIFIER WITH AUTOMATIC ADJUSTMENT OF THE BIAS CURRENT ABSORBED BY THE FINAL STAGE

[75] Inventors: Sergio Palara, Bareggio; Aldo Torazzina, Monza, both of Italy

[73] Assignee: SGS-ATES Componenti Elettronici S.p.A., Catania, Italy

[21] Appl. No.: 523,052

[22] Filed: Aug. 15, 1983

[30] Foreign Application Priority Data

Sep. 24, 1982 [IT] Italy .............................. 23443 A/82

[51] Int. Cl.$^4$ .............................................. H03F 3/30
[52] U.S. Cl. .................................... 330/267; 330/273; 330/296

[58] Field of Search ............... 330/267, 268, 273, 274, 330/296

[56] References Cited

U.S. PATENT DOCUMENTS 4,331,930  5/1982  Shibata et al. ..................... 330/273
4,439,743  3/1984  Schwarz et al. .................... 330/296

Primary Examiner—James B. Mullins
Assistant Examiner—G. Wan
Attorney, Agent, or Firm—Cushman, Darby & Cushman

[57] ABSTRACT

A current control circuit coupled to the final stage of the amplifier automatically adjusts the bias current of the final stage so that it is low in the no-load state and higher in the load state. The low no-load value avoids useless energy leakages and heat dissipations, while the higher load value avoids "cross-over" distortions.

6 Claims, 2 Drawing Figures

POWER AUDIO-AMPLIFIER WITH AUTOMATIC ADJUSTMENT OF THE BIAS CURRENT ABSORBED BY THE FINAL STAGE

BACKGROUND OF THE INVENTION

The present invention relates to a power audio-amplifier provided with the capability of automatic adjustment of the bias current absorbed by the final stage.

It is known that power audio-amplifiers are affected by "cross-over" distortions, from which troublesome noises can result, particularly in case of radio transmissions.

It is likewise known that such distortions can be avoided by keeping the bias current absorbed by the final stage, also called the rest-current, at a relatively high value such as 10÷15 mA.

Such current, if it can be accepted in the normal load condition is excessive in the no-load condition, particularly if the current is provided by a battery and the amplifier is destined to be contained in a rather small casing. In such case, the high bias current absorbed during the no-load condition, on one hand causes the quick discharge of the battery and, on the other hand creates an undesirable heat dissipation.

On the other hand, as has already been said, more limited bias currents, as for example 1 mA, would not run down the battery and would dissipate much less heat, but during the load condition would originate the above described "cross-over" phenomena.

Considering this, the object of the present invention is to realize a power audio-amplifier, which is able to combine the two needs of avoiding "cross-over" phenomena during the load working and limiting the run down of the battery and the heat dissipation during the no-load working.

SUMMARY OF THE INVENTION

According to the invention such an object is reached by means of an amplifier characterized in that it comprises a current control circuit coupled to its final stage so as to automatically and continuously change the bias current of the final stage from a lower value to a higher value when switching the amplifier from the no-load working condition to the load working condition.

In other words, the amplifier according to the invention solves the above explained problem, by causing the bias current of the final stage to change according to the working condition. More precisely, in the no-load working condition, the above mentioned bias current is kept at a lower value (for example 1 mA) able to suitably limit the current consumption and the heat dissipation, while in the load working condition the same current is automatically increased to a higher value, depending on the signal amplitude and on the value of the load resistance, up to a maximum limit (for example 15 mA), so as to avoid the "cross-over" distortions. The two above mentioned needs are thus satisfied without creating other problems.

BRIEF DESCRIPTION OF THE DRAWINGS

The characteristics of the present invention will be explained after an examination of the following detailed description of an embodiment illustrated by way of non-limitative examples in the enclosed drawings, in which.

DETAILED DESCRIPTION OF THE PREFERRED EMBODIMENT

Figure 1:
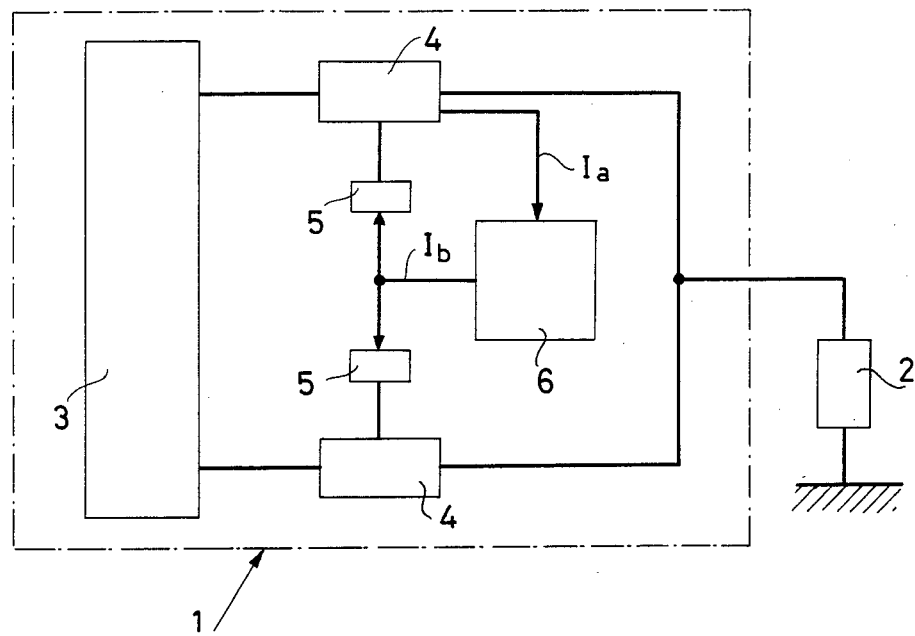
FIG. 1 shows a general block diagram of the amplifier according to the invention.

With reference to FIG. 1, there is illustrated a power audioamplifier, at the output of which a load 2 is applied.

The amplifier 1 comprises one or more amplifying stages 3, to which is attached a power final stage including two half stages 4, the upper one for the positive half-wave and the lower one for the negative half-wave of the input voltage. Everyone of the two half stages is provided with a bias chain 5, of a per se known kind.

In addition to the above mentioned known circuit parts, the amplifier 1 comprises a current control circuit 6, which receives from the upper half stage 4 (relative to the positive half wave) a current $I_a$ representing a fraction of the current required by the load. Depending upon control current $I_a$, said circuit 6 creates a current $I_b$ which is able to act on the bias chains 5 of the two half stages so as to change the current absorbed by the same half stages from a lower value (~1 mA) in no-load working conditions to a higher, upwardly limited value (~15 mA) in load working conditions.

Figure 2:
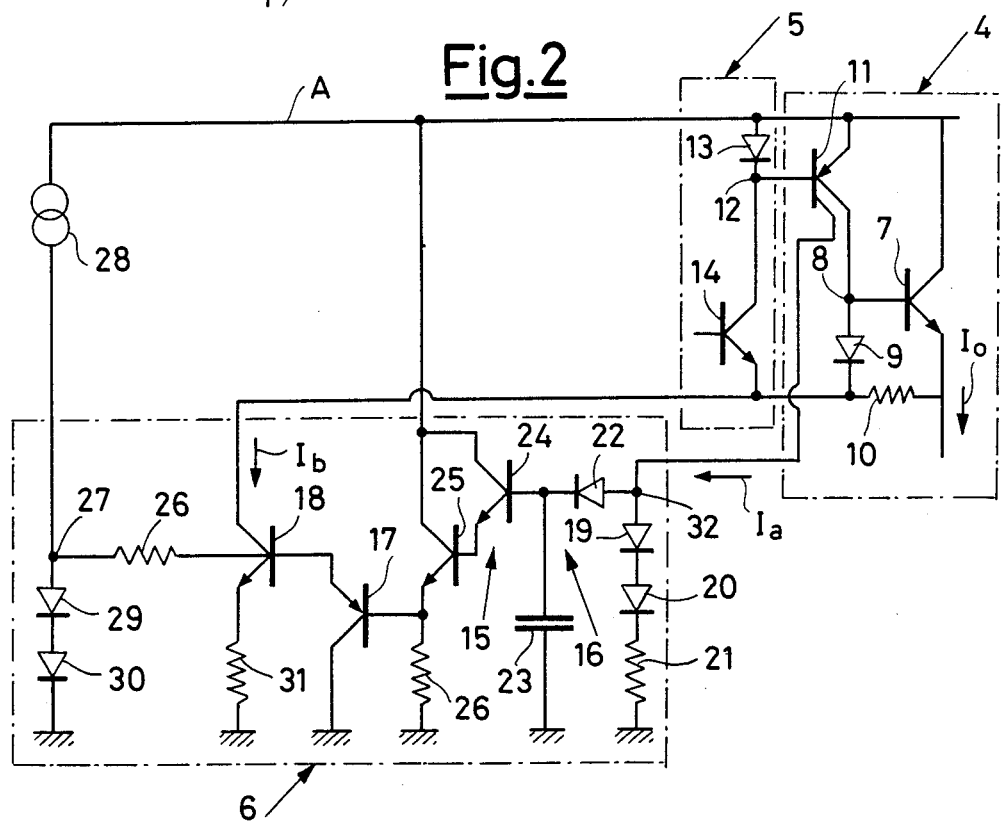
FIG. 2 shows the circuit details of a part of said amplifier, including said current control circuit.

The details of control circuit 6 are illustrated in FIG. 2 together with details of the upper half stage 4 and of the respective bias chain 5. It can be seen therein that the upper half stage 4 comprises an NPN transistor 7 interposed between an alternate-current feeding line A. Transistor 7 is the load and driven at the base by the signal present in a central node 8 which is connected to the emitter of the transistor 7 through the series network of a diode 9 and a resistance 10. The base of transistor 7 is coupled to the feeding line A by means of a PNP transistor 11. Transistor 11 has its base connected to a central node 12 which is situated between a diode 13 and an NPN transistor 14 which is serially connected to the feeding line A so as to constitute the bias chain 5 (or at least a part thereof). From an additional electrode of the PNP transistor 11 there is taken the current $I_a$ for the current control circuit 6.

The control circuit 6 comprises a voltage and impedance translator of the Darlington kind 15, which is driven by the current $I_a$ through a detector 16 which is provided with an operational threshold. Transistor 15 drives an actuator circuit including a PNP transistor 17 and an NPN transistor 18, which operates as an adjuster for the current $I_b$ which passes through it. More precisely, the functions of the operational threshold are carried out by two diodes 19 and 20 and by a resistor 21 connected in series between ground and a circuit node 32 which is connected to the above-mentioned additional electrode of the transistor 11, from which is taken the current $I_a$. The detector 16 is formed by a diode 22 and by a capacitor 23 connected in a per se conventional way. The Darlington circuit 15 on the other hand comprises two NPN transistors 24 and 25, where transistor 24 is driven at its base by the detector 16 and transistor 25 feeds, when in conduction, a resistor 26. To the emitter of the transistor 25, there is connected the base of the NPN transistor 17, which is interposed between the base of NPN transistor 18 and ground. A resistor 25 connects the above mentioned base of the transistor 18 to a circuit node 27 fed by a current generator 28 and connected to ground through the series network of two diodes 29 and 30. A resistor 31 is finally interposed between ground and the emitter of the transistor 18, whose collector is connected to the feeding line A through the transistor 14 and the diode 13 for the conduction of the current $I_b$.

In the no-load working condition, the transistor 7 of the upper final half stage 4 passes a bias or rest current $I_o$, whose value is approximatively equal to 1 mA. The energy leakage and the heat dissipation are therefore extremely limited.

In such conditions, the current $I_a$ (a predetermined fraction of the current required by the load), which is taken from the PNP transistor 11, is so low that the voltage at the circuit node 32, and consequently at the ends of the capaciter 23 of the detector 16, is not able to bring into conduction the transistor 24 of the Darlington circuit 15. The transistor 25 of the same Darlington is therefore "off". When transistor 25 is "on", the PNP transistor 17 takes the current from the resistor 26 and keeps the base of the NPN transistor 18 at a level so low as to cause the "switching off" of the same transistor 18 and consequently the annulment of the current $I_b$. The current $I_b$ naturally keeps low the current $I_o$.

The passage from the no-load working condition to the load working condition can be detected by the upper half stage 4 both as an increase of the current required by the load and as a signal applied to the node 8. In any case, there results a greater conduction of the transistors 7 and 11 and consequently an increase of $I_a$, which produces in the node 32 a voltage higher than the operation threshold of the Darlington 15. By charging the capacitor 23, said voltage causes the "switching on" of the Darlington 15 and therefore the gradual "switching off" of the PNP transistor 17, which in its turn switches on the NPN transistor 18, through which there occurs a current passage $I_b$ having a value increasing up to a maximum which is equal to the ratio between the base/emitter voltage of the transistor 18 and the ohmic value of the resistance 31. Said current $I_b$ influences the bias chain 5 of the upper half stage 4, as well as the corresponding bias chain of the lower half stage, so as to cause the increase of the bias current $I_o$ to a greater value (for example up to 15 mA) which is able to avoid the "cross-over" distortions.

This situation, created during the positive half wave of the feeding voltage A, that is during the conduction step of the upper half stage 4, also remains during the successive negative half wave, that is during the conduction step of the lower half stage, due to the capacitor 23, which discharges through the Darlington 15 and the resistance 26 with a discharge time (fixed by the ohmic value of the resistance 26 multiplied by the gain of the Darlington 15) which is high enough to keep the system in the condition previously fixed for the whole running time of the lower half wave. This obviously holds true providing that the involved frequency is high enough to assure a half wave time lower than the discharge time of the condenser 23; otherwise the value $I_o$ during the negative half wave would tend to reduce. On the other hand, this disadvantage would be compensated by the fact that for the low frequencies the "cross-over" distortion is much less evident.

We claim:

1. A power audio amplifier, comprising:
   at least one amplifying stage;
   a final stage coupled to said at least one amplifying stage and having a bias current and an output adapted to provide an output current to a load having a load and a no-load state; and
   current control means, coupled to said final stage, for automatically changing said bias current between a low and a higher value when said load changes between said no-load and said load state, respectively.

2. An amplifier according to claim 1 wherein said final stage includes:
   first and second half stages coupled in parallel between said at least one amplifying stage and said final stage output, said first half stage providing a fraction of said output current to said current control means; and
   first and second bias chains coupled between said current control means and said first and second half stages, respectively.

3. An amplifier according to claim 2 wherein said current control means includes:
   detector means, for receiving said current fraction and providing a signal when said current fraction crosses a predetermined threshold;
   translator means, coupled to said detector means, for translating said signal into an actuating signal; and
   actuating means for causing said first and second bias chains to change said final stage bias current in response to said actuating signal.

4. An amplifier according to claim 3 further including at least one resistor connected in cascade with respect to said translator means, and wherein said detector means includes a capacitor having a discharge time fixed by said at least one resistor.

5. An amplifier according to claim 3 wherein said translator means includes a Darlington circuit.

6. An amplifier according to claim 3 wherein said actuator means includes a PNP transistor driven by said translator means, and an NPN transistor driven by said PNP transistor.

* * * * *